United States Patent
Luecking et al.

(10) Patent No.: US 7,304,593 B2
(45) Date of Patent: Dec. 4, 2007

(54) LINEARIZATION CIRCUIT WITH DIGITAL ELEMENT MATCHING FOR DIGITAL-TO-ANALOG CONVERTERS

(75) Inventors: Dieter Luecking, Freiburg (DE); Carsten Noeske, Sexau (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 11/492,712

(22) Filed: Jul. 25, 2006

(65) Prior Publication Data
US 2007/0018869 A1    Jan. 25, 2007

(30) Foreign Application Priority Data
Jul. 25, 2005   (DE)   ............ 10 2005 035 225

(51) Int. Cl.
*H03M 3/00* (2006.01)
(52) U.S. Cl. .................. 341/143; 341/144
(58) Field of Classification Search ........ 341/144, 341/143, 141, 153
See application file for complete search history.

(56) References Cited

U.S. PATENT DOCUMENTS

| | | | |
|---|---|---|---|
| 5,404,142 A | 4/1995 | Adams et al. | 341/144 |
| 5,684,482 A | 11/1997 | Galton | 341/144 |
| 6,292,125 B1 * | 9/2001 | Conroy | 341/153 |
| 6,384,761 B1 | 5/2002 | Melanson | 341/143 |
| 6,583,742 B1 * | 6/2003 | Hossack | 341/144 |

OTHER PUBLICATIONS

Welz et al., "Simplified Logic for First-Order and Second-Order Mismatch-Shaping Digital-to-Analog Converters," IEEE Transactions on Circuits and Systems-11: Analog and Digital Signal Processing, vol. 48, No. 11, pp. 1014-1027, Nov. 2001.

* cited by examiner

*Primary Examiner*—Peguy JeanPierre
(74) *Attorney, Agent, or Firm*—O'Shea, Getz & Kosakowski, P.C.

(57) ABSTRACT

A linearization circuit with digital element matching for digital-to-analog converters includes an n-bit delta-sigma modulator that receives an input signal and provides a modulated n-bit signal. An encoder receives the modulated n-bit signal and provides an encoded signal (X) having $2^n$ signal components ($x0, x1, \ldots, x2^n-1$). $2^n$ digital-to-analog converter elements each receive an associated one of the $2^n$ signal components ($x0, x1, \ldots, x2^n-1$) and provide an associated analog signal component ($a0, a1, \ldots, a2^n-1$) indicative thereof. A summer receives and sums the analog signal components to provide an analog output signal. A weighting factor supply device provides a first weighting factor (W+) for activated ones of the digital-to-analog converter elements and a second weighting factor (W−) for non-activated ones of the digital-to-analog converter elements, where the encoder is responsive to the first and second weighting factors.

19 Claims, 3 Drawing Sheets

LINEARIZATION CIRCUIT WITH DIGITAL ELEMENT MATCHING FOR DIGITAL-TO-ANALOG CONVERTERS

PRIORITY INFORMATION

This patent application claims priority from German patent application 10 2005 035 225.1 filed Jul. 25, 2005, which is hereby incorporated by reference.

BACKGROUND INFORMATION

The invention relates to a linearization circuit with digital element matching for digital-to-analog converters.

A linearization circuit with digital element matching compensates for mismatch errors in multibit digital-to-analog converters. FIG. 4 illustrates a known architecture for a digital-to-analog converter (DAC). An n-bit delta-sigma modulator 1, receives a digital input signal i and outputs a modulated n-bit signal to a thermometer encoder 2. The encoder 2 generates a $2^n$1-bit signal in the form of a higher-order encoded signal X with $2^n$ signal components x0, x1, x2, . . . , $x2^n-1$ which is supplied to appropriate output lines. Each of the output lines leads to a separate 1-bit digital-to-analog converter element 3 that converts the value of the input-side signal component of the higher-order encoded signal X to a corresponding analog signal component a0, a1, a2, . . . , $a2^n-1$ and applies it through an accumulator 4. The accumulator 4 adds the applied analog signal components a0, a1, a2, . . . , $a2^n-1$ to provide an analog output signal A.

In an arrangement of this type, each bit, or each encoded signal component x0, x1, . . . , $x2^n-1$, thus controls the activation of one of the 1-bit digital-to-analog converter elements 3. In the event all the 1-bit digital-to-analog converter elements 3 had exactly the same weighting, the summed analog output signal A would correspond exactly to an analog representation of the digital input signal i, or of the modulated n-bit signal in, at the input of the encoder 2. In a VLSI implementation each of the 1-bit digital-to-analog converter elements 3 differs from the others due to an element mismatch. Typical mismatch errors are on the order of 1 . . . 2% rms. This factor causes a significant nonlinearity that results in a degradation of the signal-to-noise ratio (SNR). Especially in the case of audio applications in which the signal-to-noise ratio must exceed 96 dB or more in order to achieve CD quality, the effect of the mismatch must be compensated. This equalization is called digital element matching (DEM).

FIG. 5 illustrates a known circuit for digital element matching with the same design as the circuit of FIG. 1. However, an arrangement to effect cyclic rotation 20 has been connected between the encoder 2 and the 1-bit digital-to-analog converter elements 3. With this approach, each of the 1-bit digital-to-analog converter elements 3 is used at least once for an outputted thermometer-encoded signal of the encoder 2. This can be implemented by rotating the encoded signal components x0, x1, . . . , $x2^n-1$ by $2^n-1$ times the clock rate of the delta-sigma modulator 1. The rotation can be performed, for example, using a barrel shifter.

FIG. 6 illustrates another circuit to effect digital element matching as disclosed in U.S. Pat. No. 5,404,142. Instead of an arrangement for cyclic rotation, this circuit contains an arrangement to effect a noise-shaped scrambling 21. The thermometer-encoded signal X, or its signal components x0, x1, . . . , $x2^n-1$, are passed through the scrambling circuit 21 which shapes the noise resulting from the element mismatch error of the 1-bit digital-to-analog converter 3. The noise is shaped in such a way that the noise energy at lower frequencies is reduced, while at higher frequencies lying outside the band of interest it is increased. This results in an improvement in the in-band signal-to-noise ratio.

A comparable noise-shaping digital-element-matching effect can also be achieved by a circuit as indicated in FIG. 7 or as specified by U.S. Pat. No. 5,684,482—however with greater hardware efficiency. In this arrangement, the encoder 2 of FIG. 4 is replaced by a scrambling encoder with a tree structure 22 that outputs corresponding higher-order encoded signal components xr0, xr1, . . . , $xr2^n-1$ to the plurality of 1-bit digital-to-analog converter elements 3. The thermometer encoder and the noise-shaping scrambling function are combined here in a tree-structured encoding arrangement.

U.S. Pat. No. 6,384,761 discloses another technique to effect digital element matching wherein each input signal of the 1-bit digital-to-analog converter elements is returned through a second-order or higher-order integrator to a vector quantizer to which the output signal of a multi-bit delta-sigma modulator is fed as a second input signal. The vector quantizer operates according to specified rules and controls the activation of the 1-bit digital-to-analog converter elements from the outputs or output signals of the integrators, and from the output or output signals of the delta-sigma modulator. A noise shaper includes an initial delay element and two cascadingly arranged integrators.

There is a need for an improved technique to effect linearization with digital element matching for a digital-to-analog converter.

SUMMARY OF THE INVENTION

A linearization circuit with digital element matching for digital-to-analog converters comprises an n-bit delta-sigma modulator that provides a modulated n-bit signal to an encoder, which provides an encoded signal containing a plurality of signal components. Each of the plurality of signal components is input to an associated one of a plurality of digital-to-analog converter elements, and each of the digital-to-analog converter elements outputs an analog signal component. An analog signal accumulator sums the analog signal components to provide an analog output signal. A weighting factor supply device provides a first weighting factor for activated blocks of the digital-to-analog converter elements and provides a second weighting factor for nonactivated blocks of the digital-to-analog converter elements.

In one embodiment, the weighting factor supply device supplies the first weighting factor for the activated block of the digital-to-analog converter elements as the total number of the active number, and supplies the second weighting factor for the nonactivated block of the digital-to-analog converter elements as the negative active number.

A switching device preferably has one switch each per encoded signal component, wherein one of the encoded signal components, or a signal dependent thereon, is applied to each of the switches as a switching signal, and each of the switches is switched as a function of the state of the applied block of the signal components, or of the relevant signal component, in order to output either the first or the second weighting factor as the switched signal. An integrator is connected following each of the switches. The integrated signals are applied to a priority selector, wherein the priority selector supplies a control signal to the encoder. The encoder selects, as a function of the control signal, digital-to-analog converter elements according to the active number of the activated block of the modulated n-bit signals to be applied to active digital-to-analog converters with the smallest total error at the accumulator. The priority selector and the encoder apply, as averaged over time, an integrated, normalized, weighted error for each of the digital-to-analog converter elements.

The encoder applies encoded signal components to the corresponding digital-to-analog converters as a function of the first and/or the second weighting factor.

A linearization technique employs digital element matching for digital-to-analog converters in which a modulated n-bit signal with a total number of bits is supplied. An encoded signal with a plurality of signal components is provided as a function of the modulated n-bit signal, in which a given analog signal component is provided by a given digital-to-analog converter element for the encoded signal components, and in which the analog signal components are added to an analog output signal, wherein a first weighting factor is supplied for the activated block of the encoded signals and a second weighting factor is supplied for the nonactivated block of the encoded signals.

The first and second weighting factors are generated by a total number of the modulated n-bit signals and an active number of the activated block of modulated n-bit signals. The first weighting factor may be generated by subtracting the active number k from the total number n according to the equation W+=n−k, and the second weighting factor may be supplied as the value of the negative active number k according to the equation W−=−k.

A switched signal as a function of the state of each of the signal components is supplied having the value either of the first or the second weighting factor. The switched signals are integrated as a function of time. Based on the totality of the switched and possibly integrated signals, a control signal is supplied to the encoder to supply the encoded signal components. The encoded signal components are selected by the encoder using the control signal in such a way that, based on the number of the active block of the modulated n-bit signals, corresponding analog signal components of activated digital-to-analog converters are accumulated to form the output signal.

The encoded signal components are encoded using the control signal such that an integrated, normalized, weighted error is applied as averaged over time for each digital-to-analog converter.

The encoded signals are employed on a weighted basis for the digital-to-analog conversion as a function of the first and/or the second weighting factor.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
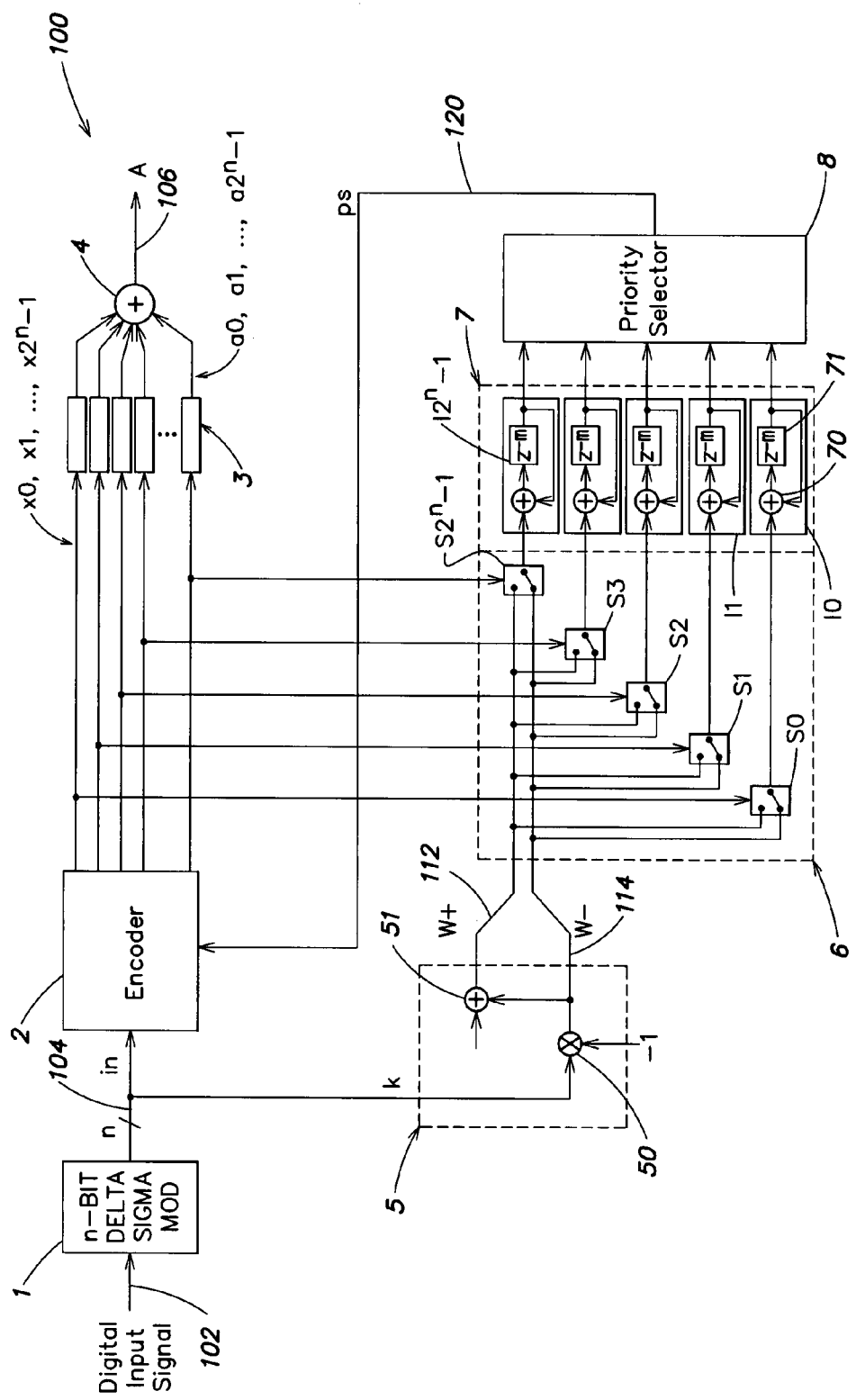
FIG. 1 illustrates a linearization circuit with digital element matching for a plurality of individual digital-to-analog converter elements.

FIG. 1 illustrates a linearization circuit 100. The linearization circuit 100 may be arranged as a VLSI device. However, it is also possible to implement alternative embodiments using, for example, separate structural components for the various components illustrated. Variations are also possible in the number of stages or total number of encoded signal components—in particular variations in the ratio of the total number of encoded signal components to the total number of modulated n-bit signals and 1-bit digital-to-analog converter elements. In the following discussion, 1-bit digital-to-analog converters are called 1-bit digital-to-analog converter elements in order to simplify the terminological distinction relative to the overall design that constitutes a digital-to-analog converter.

The circuit 100 includes an n-bit delta-sigma modulator 1 that receives a digital input signal on a line 102 and outputs a modulated n-bit signal on a line 104. The modulated n-bit signal on the line 104 is input to an encoder 2. The encoder 2 generates a $2^n$ 1-bit signal as a higher-order encoded signal X with $2^n$ signal components x0, x1, x2, ..., $x2^n-1$ which are supplied on corresponding output lines. Each of the output lines leads to a separate 1-bit digital-to-analog converter element 3 that converts the value of the associated component of the encoded signal X to a corresponding analog signal component a0, a1, a2, ..., $a2^n-1$ and applies it through an output to an accumulator 4. The accumulator 4 adds the applied analog signal components a0, a1, a2, ..., $a2^n-1$ to provide an analog output signal on a line 106.

The circuit 100 includes a weighting factor supply device 5, a switching device 6, a plurality of integrators in an integrator device 7, and a priority selector 8. The encoded signal components x0, x1, ..., $x2^n-1$ are provided as a function of a first weighting factor W+ on a line 112 for the activated digital-to-analog converter elements 3 and a second weighting factor W− on a line 114 for the nonactivated digital-to-analog converter elements 3.

To effect digital element matching or matching of the individual encoded signals x0, x1, ..., $x2^n-1$ for the individual 1-bit digital-to-analog converter elements 3, the two data-dependent weighting factors W+, W− are accordingly determined for the element mismatch. The first weighting factor W+ is supplied for an activated 1-bit digital-to-analog converter element 3 for the purpose of supplying the element's corresponding encoded signal x0, x1, ..., $x2^n-1$. The second weighting factor W− is supplied for nonactivated 1-bit digital-to-analog converter elements 3 for the purpose of supplying the elements' encoded signals x0, x1, ..., $x2^n-1$. The effect of the error of a given one of the 1-bit digital-to-analog converters 3 on the total digital-to-analog converter error in the output signal A on the line 106 is a function of an active number k as the number of active encoded signals or the active 1-bit digital-to-analog converter elements 3.

This dependent relationship may be illustrated by an example of a 3-bit digital-to-analog converter where the normalized weighting of one (1) plus an individual mismatch error e0, e1, e2 is associated with each of the three 1-bit digital-to-analog converter elements 3. For the three corresponding 1-bit digital-to-analog converter elements, the resulting values are 1+e0, 1+e1 or 1+e2.

For all the possible digital input codes the analog output signal A on the line 106 can be generated. The digital input codes are represented here by three encoded signals x0, x1, x2. By mapping code 000 to −1 and code 111 to +1 as a normalized domain for the entire digital-to-analog converter, a correspondingly determined normalized error f can be determined, as is illustrated by way of example in the following table.

TABLE

| x2 | x1 | x0 | A | Mapping m | Normalized Error f |
|---|---|---|---|---|---|
| 0 | 0 | 0 | 0 | −1 | 0 |
| 0 | 0 | 1 | 1 + e0 | −⅓ | −e2 − e1 + 2 * e0 |
| 0 | 1 | 0 | 1 + e1 | −⅓ | −e2 + 2 * e1 − e0 |
| 0 | 1 | 1 | 2 + e0 + e1 | +⅓ | −2 * e2 + e1 + e0 |
| 1 | 0 | 0 | 1 + e2 | −⅓ | 2 * e2 + e1 − e0 |
| 1 | 0 | 1 | 2 + e0 + e2 | +⅓ | e2 + 2 * e1 + e0 |
| 1 | 1 | 0 | 2 + e1 + e2 | +⅓ | e2 + e1 − 2 * e0 |
| 1 | 1 | 1 | 3 + e0 + e1 + e2 | +1 | 0 |

Referring to the table, in the first three columns of each line, the table reproduces the corresponding values for the encoded signals x2, x1, x0, where these have, for example, either the value 0 or the value 1. Following from this, depending on the code, is the corresponding value of the analog output signal on the line 106. The fifth column presents the corresponding mapping m, while the sixth column presents the corresponding normalized error f. Based on the first line with code 000, the result for the analog output signal A on the line 106 is a value 0 that is mapped to the value m=−1 and has a normalized error f=0 since none of the 1-bit digital-to-analog converters 3 has been activated and accordingly no error effect is recorded. The second line shows the case for code 001, with the first of the encoded signal components x0 in the active state having a value 1. For the analog output signal A on the line 106, the result is A=1+e0. The mapping is effected to m=−⅓. The normalized error is determined as f=−e2+(−e1)+2*e0. In subsequent lines, the corresponding values for the various possible codes are indicated analogously.

The table shows that each individual error of the individual 1-bit digital-to-analog converter elements 3 has a different normalized weighting relative to the others as a function of the number of activated elements. In addition, the normalized weighting for an n-stage digital-to-analog converter is generalizable as indicated by the following embodiments.

If a digital-to-analog converter has an n number of 1-bit digital-to-analog converter elements 3, and of these one active number k of the elements is activated, that is k<=m, then for the normalized weighting of error f there follows a weighting possibility by the first and by the second weighting factor W+, W−. For an activated element, the weighting factor W+ is equal to the difference between the total number n and the active number k, that is, W+=n−k applies. The second weighting factor W− for the nonactivated elements corresponds to the negative active number k, that is, W−=−k. This mapping relation is evident based on a comparison of the first three columns with the last column of the table.

The first and second weighting factors W+, W− are determined in the weighting factor supply device 5. In order to compensate the mismatch error, the circuit, along with the additional components as well, ensures that the integrated, normalized, weighted errors as viewed over time equal zero for each of the 1-bit digital-to-analog converters. In terms of the effect, this is equivalent to effecting a noise-shaping of the mismatch error.

The weighting factor supply device 5 may include a multiplier 50 that multiplies the active number k and factorization value −1. The value of the active number k is supplied as the number of lines or modulated n-bit signals in having an active signal on the lines. In addition, the weighting factor supply device 5 includes an adder 51. The output value of the multiplier 50, is the value −k, which is also applied to the adder 51. The output value −k from the multiplier 50 is output from the weighting factor supply device 5 as second weighting factor W−=−k. The output value of the adder 51 is supplied as the first weighting factor W+ for active elements with W+=n−k.

The first and second weighting factors W+, W− are fed to the switching device 6, which includes a plurality of switches S0, S1, . . . , S$2^n$−1, where the weighting factors W+, W− are applied to each of the switches. The switches S0, . . . , S$2^n$−1 are controlled by an associated switching signal that corresponds to the state of an associated one of the encoded signal components x0, . . . , x$2^n$−1. If one of the signal components x0, . . . , x$2^n$−1 is in the active state, its associated switch S0, . . . , S$2^n$−1 switches to the switching input at which the first weighting factor W+ is applied. Otherwise the associated switch S0, . . . , S$2^n$−1 switches to the input at which the second weighting factor W− is applied.

An integrator 7 includes a plurality of individual integrators I0, I1, . . . , I$2^n$−1. It is also possible, for example, to employ another accumulator device in place of this integrator device 7. Each of the individual integrators I0, I1, . . . , I$2^n$−1 includes an input-side adder 70, a delay element 71 being connected at each output of these adders. The output value of the delay element is fed to an input of the preceding adder 70.

The output value from one of the switches S0, S1, . . . , S$2^n$−1 associated on a one-to-one basis with this integrator I0, . . . , I$2^n$−1 is applied to the second input of the adder 70. The output values of the delay elements 71 of all individual integrators I0, I1, . . . , I$2^n$−1 are provided to a priority selector 8.

The priority selector 8 operates as a priority decoder and determines at which accumulator output the greatest error is currently applied. The priority selector 8 provides a priority signal ps on a line 120 based on this obtained information to the encoder 2 in the form of a code generator to control the encoder. Depending on this result, the encoder 2 decides which of the 1-bit digital-to-analog converter elements 3 are utilized in the subsequent cycle and which are not. As a result, large errors are corrected first and the total error more quickly becomes zero.

In this embodiment, the normalized weighted error for each of the 1-bit digital-to-analog converters 3 is accumulated in an associated one of the integrators I0, I1, . . . , I$2^n$−1 of the integrator device 7. The accumulated values are entered into the priority selector 8. If the n-bit input signal with the value k active signals or lines is applied at the input of the encoder 2, then the encoder 2 selects based on this active number k corresponding digital-to-analog converter elements from the $2^n1$ of the 1-bit digital-to-analog converter elements 3 such that the 1-bit digital-to-analog converter elements 3 connected to the accumulator 4 with the lowest sum or error sum are activated.

Figure 2:
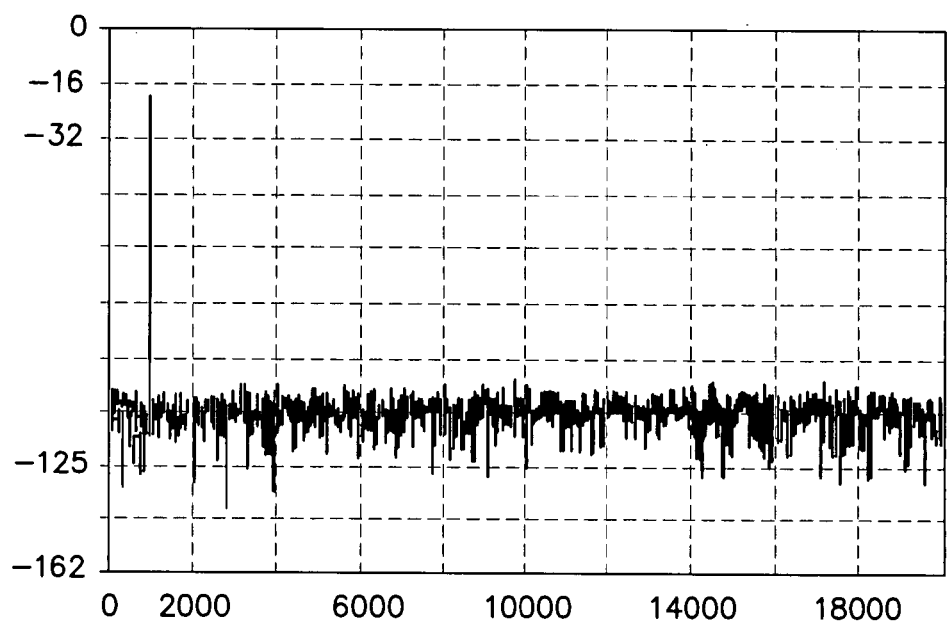
FIG. 2 shows a plot of an output signal of an eight-stage digital-to-analog converter with a thermometer encoder and without mismatch shaping after applying a fast Fourier transform based on a simulation result with a 1% rms mismatch having a signal-to-noise ratio of 80 dB.

FIG. 2 illustrates a plot of the result of a Fourier transformation to simulated data of an eight-stage digital-to-analog converter with a thermometer encoder of prior art without mismatch shaping having a 1% rms mismatch error and a signal-to-noise ratio of 80 dB.

Figure 3:
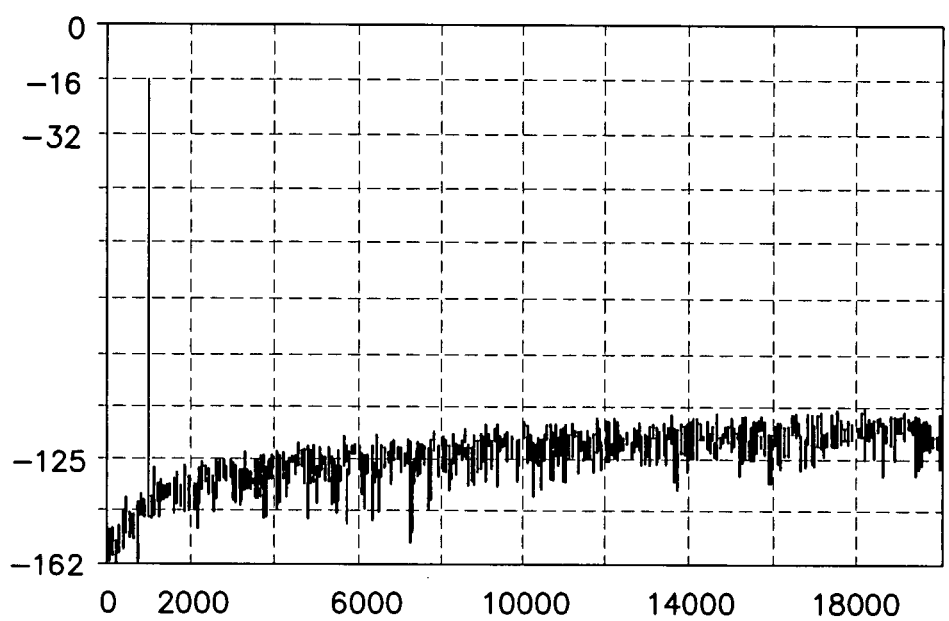
FIG. 3 is a plot of this type with mismatch shaping according to a preferred embodiment and a signal-to-noise ratio of 104 dB.
Figure 4:
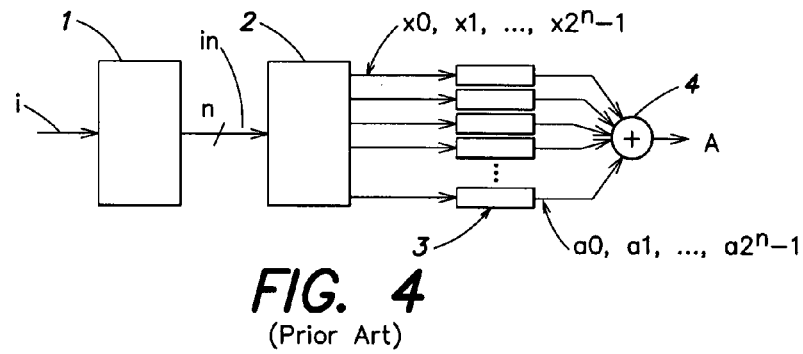
FIG. 4 illustrates a known linearization circuit having a thermometer encoder and a plurality of individual digital-to-analog converter elements.
Figure 5:
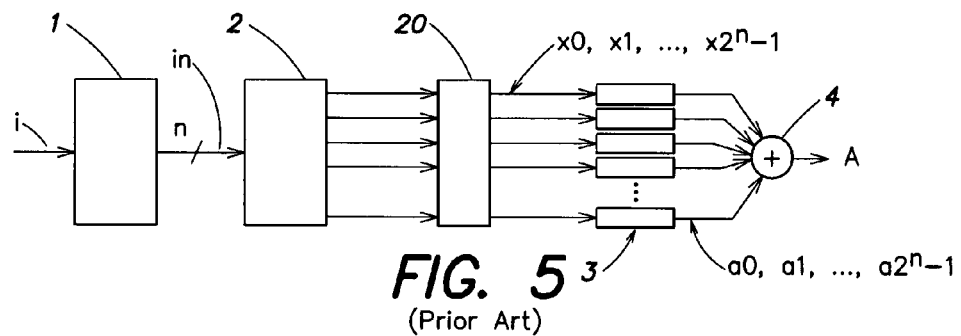
FIG. 5 illustrates a known linearization circuit having a scrambling circuit to effect cyclic rotation of encoded signals based on prior art.
Figure 6:
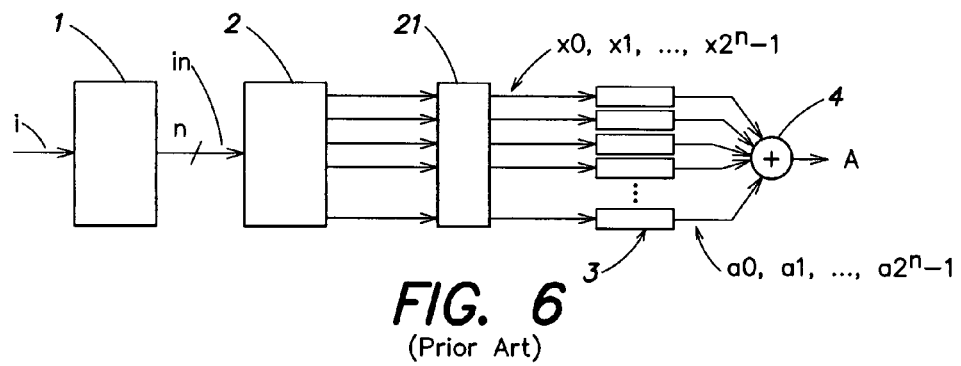
FIG. 6 illustrates a known linearization circuit having a scrambling circuit to effect noise shaping.
Figure 7:
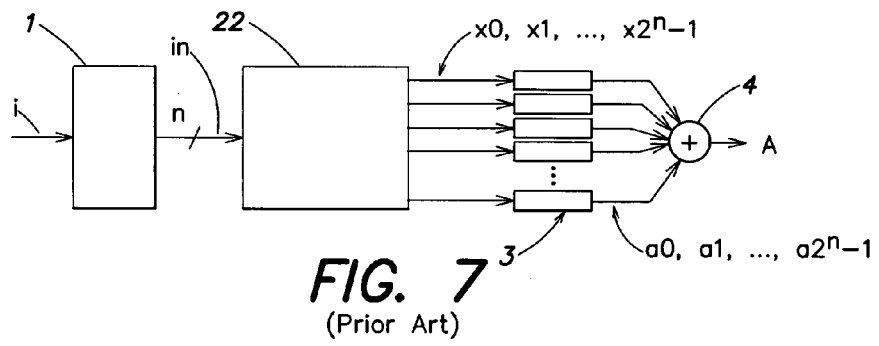
FIG. 7 illustrates a known linearization circuit having a scrambling encoder with a tree structure.

FIG. 3 is a graph illustrating corresponding data wherein a method is employed based on the preferred embodiment for mismatch shaping. As a result, a signal-to-noise ratio of 104 dB is achievable such that the advantageous effect of the present invention is clearly evident.

Although the present invention has been illustrated and described with respect to several preferred embodiments thereof, various changes, omissions and additions to the form and detail thereof, may be made therein, without departing from the spirit and scope of the invention.

What is claimed is:

1. A linearization circuit with digital element matching for digital-to-analog converters, comprising:
   an n-bit delta-sigma modulator that receives an input signal and provides a modulated n-bit signal;
   an encoder that receives the modulated n-bit signal and provides an encoded signal (X) having $2^n$ signal components (x0, x1, ..., x$2^n$–1);
   $2^n$ digital-to-analog converter elements that each receives an associated one of the $2^n$ signal components (x0, x1, ..., x$2^n$–1) and provides an associated analog signal component (a0, a1, ..., a$2^n$–1) indicative thereof;
   a summer that receives and sums the analog signal components to provide an analog output signal; and
   a weighting factor supply device that provides a first weighting factor (W+) for activated ones of the digital-to-analog converter elements and a second weighting factor (W−) for non-activated ones of the digital-to-analog converter elements, where the encoder is responsive to the first and second weighting factors.

2. The circuit of claim 1, where the weighting factor supply device determines the first and second weighting factors as a function of the number of n-bits and the number k of the activated ones of the digital-to-analog converter elements.

3. The circuit of claim 2, where the weighting factor supply device provides the second weighting factor equal to the value (−k) and the first weighting factor equal to the value (n−k).

4. The circuit of claim 2, comprising a switching device comprising $2^n$ switching elements that each receives the first and second weighting factors and provides a switch output signal where the value of the switch output signal is determined based upon the value of the associated one of the $2^n$ signal components (x0, x1, ..., x$2^n$–1).

5. The circuit of claim 4, comprising $2^n$ integrators (I1, I2, ..., I$^{2n}$–1) where each of the integrators receives the switch output signal from an associated one of the $2^n$ switching elements to provide $2^n$ integrator output signal values.

6. The circuit of claim 5, comprising a priority selector that receives the $2^n$ integrator output signal values and provides a control signal selected from the $2^n$ integrator output signal values.

7. The circuit of claim 6, where the encoder receives the control signal and sets its output value based upon which of the $2^n$ integrator output signal values represents the smallest total error.

8. The circuit of claim 7, where the priority selector and the encoder are configured and arranged to apply an integrated, normalized, weighted error.

9. The circuit of claim 6, where the encoder applies the encoded signal components (x0, ..., x$2^n$–1) as a function of the first and second weighting factors to the corresponding digital-to-analog converter elements.

10. A linearization method with digital element matching for digital-to-analog converters, comprising the steps of:
    delta-sigma modulating an input signal to provide a modulated n-bit signal;
    encoding the modulated n-bit signal to provide an encoded signal (X) that includes a plurality of signal components (x0, x1, ..., x$2^n$–1);
    digital-to-analog converting each of the plurality of signal components (x0, x1, ..., x$2^n$–1) to provide an associated plurality of analog signal components (a0, a1, ..., a$2^n$–1) that are summed to provide an analog output signal indicative of the input signal; and
    processing the modulated n-bit signal to generate a first weighting factor (W+) and a second weighting factor (W−) where the step of encoding is responsive to the first weighting factor (W+) and the second weighting factor (W−).

11. The method of claim 10, where the step of processing comprises determining the first and second weighting factors as a function of the number of n-bits and number k of the activated ones of the plurality of signal components (x0, x1, ..., x$2^n$–1).

12. The method of claim 11, where the first weighting factor is equal to (n–k) and the second weighting factor is equal to the negative value of k.

13. The method of claim 12, where, as a function of the state of each of the signal components (x0, x1, ..., x$2^n$–1), one switched signal each is supplied with the value either of the first or of the second weighting factor (W+, W−).

14. The method of claim 13, where the switched signals are integrated over time.

15. The method of claim 14, where a control signal (ps) is supplied for an encoder to supply the encoded signal components (x0, x1, ..., x$2^n$–1).

16. The method of claim 15, where using the control signal (ps) the encoded signals are selected such that based on the number (k) of the active block of modulated n-bit signals (in) corresponding analog signal components (a0, a1, ..., a$2^n$–1) of activated digital-to-analog converters are accumulated to form the output signal (A).

17. The method of claim 16, where the encoded signal components are encoded by the controls signal (ps) such that for each digital-to-analog converter an integrated, normalized, weighted error (e0, e1, ..., e$2^n$–1) is applied as averaged over time.

18. The method of claim 17, where the encoded signals are employed on a weighted basis for the digital-to-analog conversion as a function of the first and/or the second weighting factors.

19. A linearization circuit with digital element matching for digital-to-analog converters, comprising:
    an n-bit delta-sigma modulator that receives an input signal and provides a modulated n-bit signal;

an encoder that receives the modulated n-bit signal and provides an encoded signal (X) having $2^n$ signal components (x0, x1, ..., x$2^n$−1);

$2^n$ digital-to-analog converter elements that each receives an associated one of the $2^n$ signal components (x0, x1, ..., x$2^n$−1) and provides an associated analog signal component (a0, a1, ..., a$2^n$−1) indicative thereof;

a summer that receives and sums the analog signal components to provide an analog output signal; and means responsive to the modulated n-bit signal for providing a first weighting factor (W+) for activated ones of the digital-to-analog converter elements and for providing a second weighting factor (W−) for non-activated ones of the digital-to-analog converter elements, where the encoder is responsive to the first and second weighting factors.

* * * * *